Nov. 23, 1965 R. C. SCHNIERS 3,219,885

TRANSISTER HEAT DISSIPATOR

Filed March 20, 1961 2 Sheets-Sheet 1

INVENTOR.
Robert C. Schniers

BY Paul J. Ethington

ATTORNEY

Nov. 23, 1965 R. C. SCHNIERS 3,219,885

TRANSISTER HEAT DISSIPATOR

Filed March 20, 1961 2 Sheets-Sheet 2

INVENTOR.

Robert C. Schniers

BY

Paul J. Etlington

ATTORNEY

United States Patent Office
3,219,885
Patented Nov. 23, 1965

3,219,885
TRANSISTOR HEAT DISSIPATOR

Robert C. Schniers, Flint, Mich., assignor to General Motors Corporation, Detroit, Mich., a corporation of Delaware Filed Mar. 20, 1961, Ser. No. 97,015
8 Claims. (Cl. 317—100)

This invention relates to a heat dissipator and more particularly relates to a transistor heat sink which forms a part of the housing for electronic gear.

In high power transistor applications it is necessary to remove the heat generated by the transistors so that the operation thereof will remain within permissible temperature limits, thereby improving equipment reliability. A means of removing the heat is to thermally couple the transistor to a heat sink comprising a massive heat conductive body having a large radiating surface.

The purpose of the invention is to provide a versatile heat sink which may be mounted in either the vertical or horizontal plane and further to provide an arrangement wherein an electrical component may be simultaneously mounted to a heat dissipator and a printed circuit board and wherein it is possible to dip solder all electrical connections in one operation.

The invention is carried out by providing a heat sink having fins so formed that effective heat transfer will take place in either the horizontal or vertical position. The invention further contemplates a heat sink to formed that it cooperates with a printed circuit board to permit electrical connection of the electrical component thereto.

Figure 1:
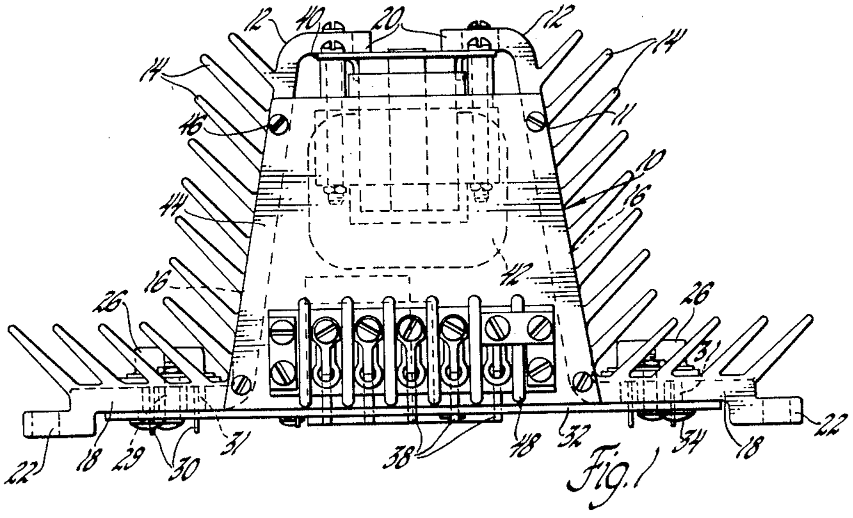
Figure 2:
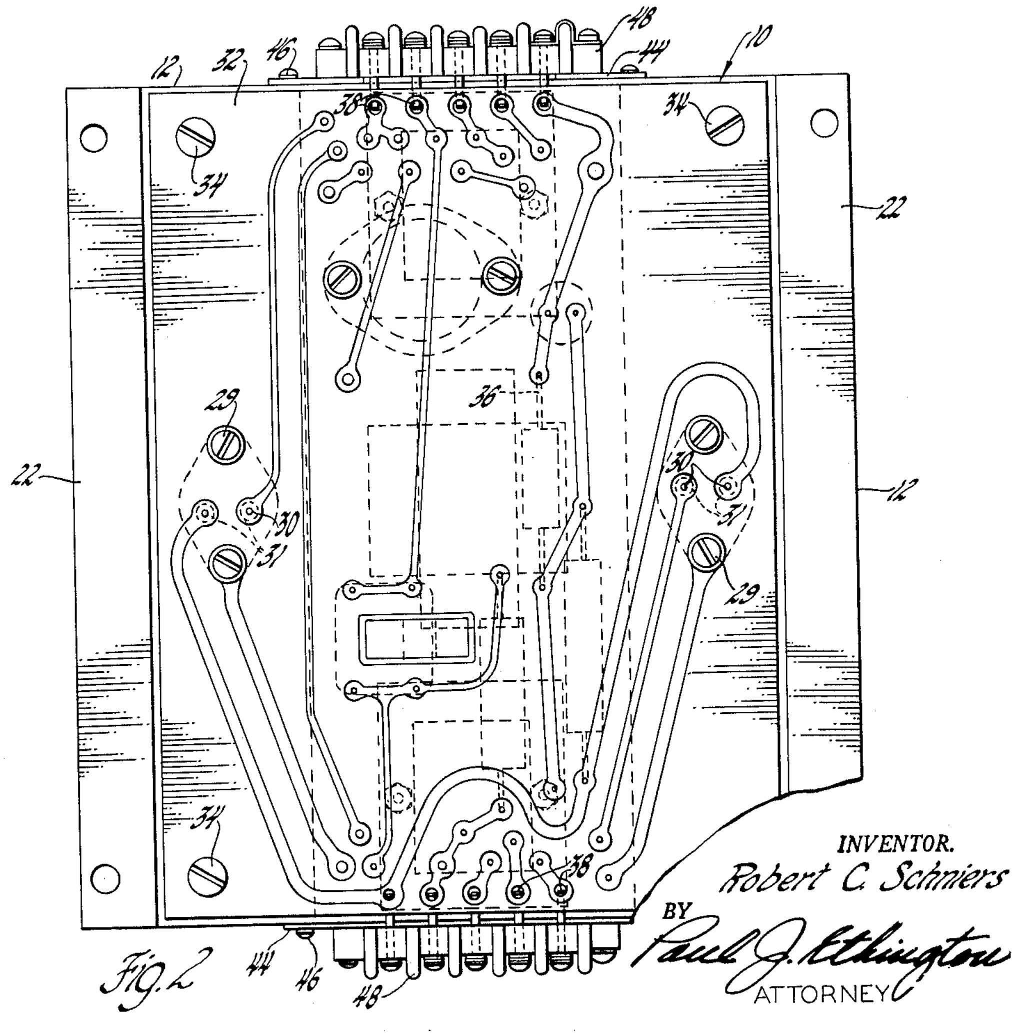
Figure 3:
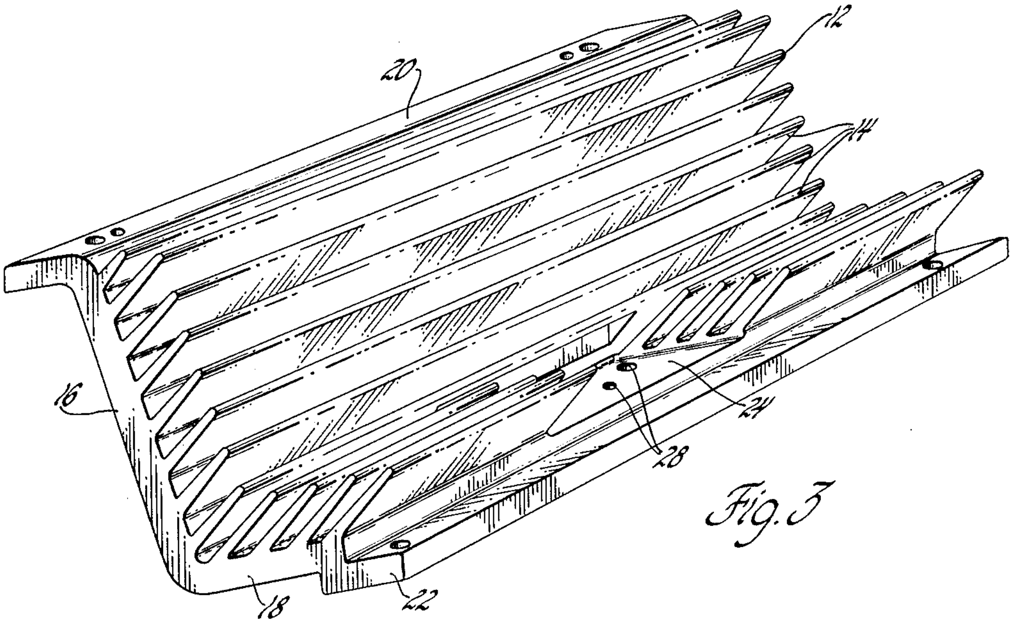
Figure 4:
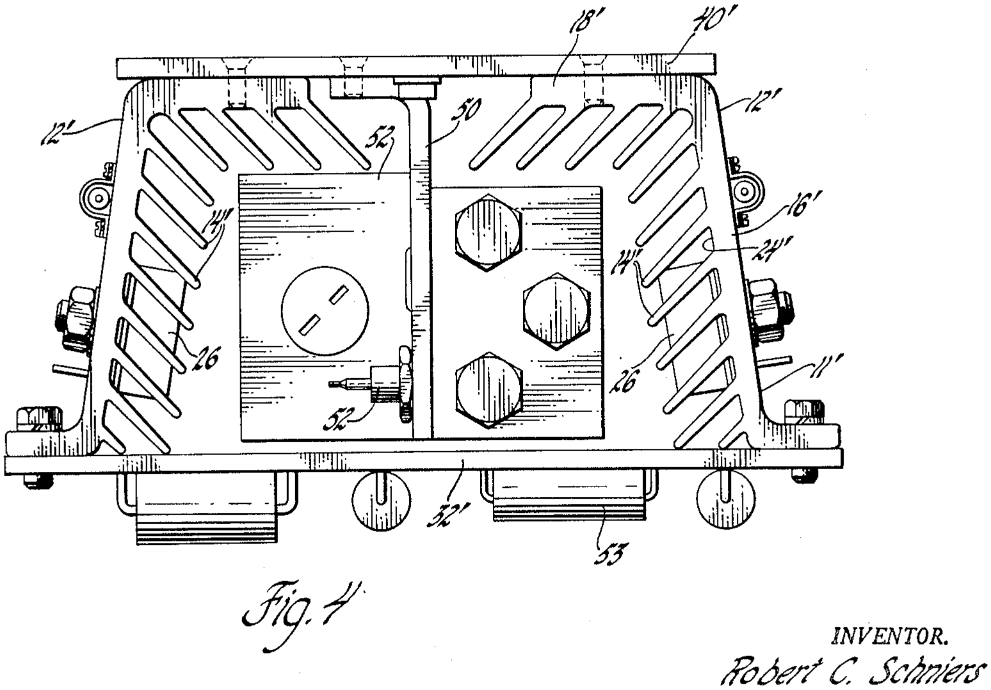

The above and other advantages of the invention will become more apparent from the following specification taken in conjunction with the accompanying drawings in which like numerals refer to like parts and in which:

FIGURE 1 is an elevational view of an electronic assembly comprising transistor heat sinks according to the invention, FIGURE 2 is a bottom view of the assembly of FIGURE 1, FIGURE 3 is a perspective view of one of the heat sinks of FIGURE 1, and FIGURE 4 is an elevational view of another embodiment of an electronic assembly comprising transistor heat sinks according to the invention.

Referring to FIGURES 1 and 2, an electronic assembly 10 is shown which is especially designed for use with a pair of power transistors 26 in push-pull relation in an oscillator power supply. The assembly 10 includes a housing 11 comprising a pair of generally L-shaped transistor heat sinks 12 having fins 14 projecting upwardly and outwardly at an angle of about 45° from the vertical. Each of the heat sinks 12, as better shown in FIGURE 3, is a long extruded member composed of aluminum or similar heat conductive material and having an L-shaped body including a leg 16 and a foot 18. The fins 14 extending from the leg 16 and the foot 18 of the L-shaped body are parallel and evenly spaced. A mounting flange 20 extends perpendicularly from the upper end of the leg 16 of the body and a similar flange 22 is formed offset from the tip of the foot 18 of the body. The fins 14 extending along the foot portion 18 of the extrusion are interrupted at an area near the midsection thereof to provide a flat surface 24 for mounting a transistor 26 in good heat transfer relationship thereto. The transistor 26 as shown is encapsulated in a conventional transistor casing. Apertures 28 extending through the foot 18 of the heat sink 12 provides means to secure the transistor 26 to the heat sink 12 by fasteners 29 and also permit the electrical leads 30 from the transistor and insulating sleeves 31 to pass the lower side of the heat sink 12.

A printed circuit board 32 extends from the foot 18 of one heat sink 12 to the other and is secured thereto by screws 34 or other suitable means. The leads 30 from the transistors 26 as well as the leads 36, 38 of other electrical components or terminals within the housing 11 extend through the printed circuit board 32 and are soldered to the lower surface thereof. It may be noted at this point that one important advantage of the invention is that it permits the electrical connections to be made by dip soldering in a single operation. At the same time the offset flanges 22 on the heat sinks 12 provide a convenient means to secure the entire assembly 12 to a flat mounting surface without subjecting the soldered connections to any injury or contact with the mounting surface.

The flanges 20 at the upper end of the heat sinks 12 extend toward each other and, in cooperation with a plate 40 fastened thereto, form the top of the housing 11. Electrical components such as the transformer 42 are supported from the plate 40 and from the flanges 20. The ends of the housing 11 are partially covered by end plates 44 fastened thereto by screws 46. Each end plate 44 supports a terminal block 48 having conventional means for making connections with outside circuits and having leads 38 extending inwardly which are soldered to the printed circuit board 32.

It is readily seen that the housing 11 made up of this type of heat sink 12 is unique in that, due to the angular position of the fins 14, the unit may be mounted horizontally (where FIGURE 1 would be the elevational view) or may be mounted vertically (where FIGURE 1 would be the plan view). In the former position convection currents would carry the heat from the heat sink 12 outwardly and upwardly past the tips of the fins 14 whereas in the latter described position the convection currents will rise in a path parallel to the longitudinal extent of the fins 14 and exit at the top end of each heat sink 12. A further advantage of the above described arrangement is that upon assembly the leads 30 of each transistor 26 may be simultaneously inserted through the heat sink 12 and the printed circuit board 32 and in addition, as mentioned above, the circuit board 32 may then be dip soldered to make all electrical connections simultaneously. This is made possible by the relatively flat lower surface presented by the assembly 10.

The embodiment of the invention depicted in FIGURE 4 comprises a pair of L-shaped transistor sinks 12′ generally similar to those sinks 12 of FIGURE 3 with the principal differences being that the flat transistor mounting surface 24′ is on the leg 16′ of the L rather than on the foot 18′, and further that the offset flange 22 has been omitted from the foot 18 of the sink. It will be noted, however, that in the embodiment of FIGURE 4 the heat sinks 12′ are turned around so that the fins 14′ extend inwardly. A printed circuit board 32′ extends between the heat sinks 12′ to form a bottom of the housing 11′ and a plate 40′ extends across the top of the housing 11′ as before. A flanged plate 50 secured to the top plate 40′ extends into the interior of the housing and forms a mounting surface for various electrical components 52. Other electrical components 53 are mounted on the lower surface of printed circuit board 32′. A suitable cover (not shown) may be placed over the components 53 if desired. This embodiment is designed for use where it is desired to cool the heat sinks 12′ by blowing air through the interior of the housing 11′ rather than utilizing exterior cooling.

Although the specific illustrations in FIGURES 1 and 4 utilize slightly different heat sink shapes it is obvious that these heat sinks could readily be made to be interchangeable between both embodiments to thereby possess the remarkable feature of being adapted to form a part of the housing 11 for either an interiorly cooled or exteriorly cooled assembly. Where both types of cooling arrangements are being produced the advantage of interchangeability of heat sinks is evident: tooling costs, which represent a principal portion of the cost of a heat sink as well as other manufacturing costs, are halved.

It is readily seen that the heat dissipators and electronic housings described herein represent a unique solution to the problem of removing heat from electronic components yet providing versatility of mounting and ease of assembly.

It will be appreciated that considerable deviation from the specific embodiments shown herein may be made within the spirit of the invention. Accordingly, it is intended that the scope of the invention be limited only by the following claims.

I claim:

1. A heat sink for an electrical component comprising a body of generally L-shaped cross-section including a leg portion and a foot portion, a series of parallel fins extending at an acute angle from the leg and foot portions, and a flat component mounting surface located near the midsection of the body.

2. A heat sink for a transistor comprising an extruded body of generally L-shaped cross-section including a leg portion and a foot portion, a series of parallel fins extending at an angle from said leg and foot portions, a flat mounting surface located near the midsection of the body, apertures extending from said mounting surface through said body, and a support flange extending from the edge of the L-shaped cross-section.

3. A heat dissipating housing including a heat sink having a generally L-shaped body forming at least part of the housing enclosure, a series of parallel fins extending at an angle from the body, an electrical component mounting surface on the heat sink, and a printed circuit board secured to said heat sink to form an additional part of said enclosure.

4. A heat dissipating housing including a plurality of heat sinks each having a generally L-shaped body connected to form at least part of the housing enclosure, a series of parallel fins extending at an angle from each body, an electrical component mounting surface on each heat sink, and a printed circuit board secured to one of said heat sinks to form an additional part of said enclosure.

5. A housing for electronic gear having sides comprising a pair of component heat sinks; each heat sink having a generally L-shaped section including a leg portion and a foot portion, a series of parallel fins extending outwardly from said leg and foot portions, and a flat component mounting surface on said section; and a printed circuit board extending between the heat sinks and secured thereto opposite said mounting surfaces to form part of the housing.

6. A housing for electronic gear comprising a pair of heat sinks each having a generally L-shaped body forming a side of the housing, a series of parallel fins extending inwardly from each body, a mounting surface on each heat sink, and a printed circuit board extending between and secured to the heat sinks to form the bottom of the housing.

7. A housing for electronic gear comprising a pair of transistor heat sinks each having a generally L-shaped body forming a side of the housing and a portion of the top thereof, a series of parallel fins extending inwardly from each heat sink, a transistor mounting surface on the inner side of each heat sink, and a printed circuit board extending between and secured to the heat sinks to form the bottom of the housing.

8. A housing for electronic gear having sides comprising a pair of component heat sinks, each heat sink having a generally L-shaped body including a leg portion and a foot portion, a series of parallel fins extending from said leg and foot portions, a flat mounting surface on each said sink, a printed circuit board extending between the heat sinks and secured thereto opposite said mounting surfaces to form part of the housing, and a component mounted on at least one of said mounting surfaces having leads extending through the corresponding heat sink and said circuit board and adapted to be dip-soldered to said circuit board.

References Cited by the Examiner

UNITED STATES PATENTS

| | | | |
|---|---|---|---|
| 1,649,741 | 11/1927 | Ruben | 317—234 |
| 2,796,559 | 6/1957 | Feucht | 317—100 |
| 2,815,472 | 12/1957 | Jackson | 317—100 |
| 2,965,819 | 12/1960 | Rosenbaum | 317—234 |

JOHN F. BURNS, *Primary Examiner.*

SAMUEL BERNSTEIN, DARRELL L. CLAY, *Examiners.*